(12) United States Patent
Doi et al.

(10) Patent No.: US 7,952,344 B2
(45) Date of Patent: May 31, 2011

(54) FREQUENCY CHARACTERISTIC MEASURING APPARATUS

(75) Inventors: Wataru Doi, Tokyo (JP); Yohei Hirakoso, Tokyo (JP)

(73) Assignee: Advantest Corporation, Tokyo (JP)

( * ) Notice: Subject to any disclaimer, the term of this patent is extended or adjusted under 35 U.S.C. 154(b) by 252 days.

(21) Appl. No.: 12/364,502

(22) Filed: Feb. 2, 2009

(65) Prior Publication Data
US 2009/0195239 A1  Aug. 6, 2009

(30) Foreign Application Priority Data
Feb. 6, 2008  (JP) ................................ 2008-026592

(51) Int. Cl.
*G01R 23/16* (2006.01)

(52) U.S. Cl. ............... 324/76.19; 324/76.11; 324/76.23; 327/39; 327/47; 327/42

(58) Field of Classification Search .................... 324/76, 324/76.19, 76.23
See application file for complete search history.

(56) References Cited

U.S. PATENT DOCUMENTS

| | | | | |
|---|---|---|---|---|
| 4,287,469 A * | 9/1981 | Harzer | ............................ | 324/620 |
| 4,451,782 A * | 5/1984 | Ashida | ........................ | 324/76.26 |
| 5,075,618 A * | 12/1991 | Katayama | .................. | 324/76.27 |
| 5,336,988 A * | 8/1994 | Chmielewski et al. | .... | 324/76.19 |
| 6,060,878 A * | 5/2000 | Doi | ............................ | 324/76.27 |
| 6,904,381 B2 * | 6/2005 | Shank et al. | .................. | 702/108 |
| 7,327,992 B2 * | 2/2008 | Earls et al. | .................... | 455/148 |
| 7,518,353 B2 * | 4/2009 | Tanbakuchi et al. | ....... | 324/76.77 |
| 7,741,831 B2 * | 6/2010 | Hirakoso | .................... | 324/76.23 |
| 2004/0066182 A1 * | 4/2004 | Evers et al. | ................. | 324/76.23 |
| 2007/0188177 A1 * | 8/2007 | Troxler et al. | ................. | 324/643 |
| 2007/0236230 A1 * | 10/2007 | Tanbakuchi et al. | .......... | 324/650 |
| 2008/0258707 A1 * | 10/2008 | Dunsmore et al. | ......... | 324/76.23 |
| 2009/0160429 A1 * | 6/2009 | Hirakoso | .................... | 324/76.23 |
| 2010/0259245 A1 * | 10/2010 | Kunie et al. | ................. | 324/76.23 |

FOREIGN PATENT DOCUMENTS

| | | | |
|---|---|---|---|
| JP | 07020169 A | * | 1/1995 |
| JP | 07244097 A | * | 9/1995 |
| JP | 7-260852 | | 10/1995 |

OTHER PUBLICATIONS

Dan Doberstein, "Tracking Generators Enhance Spectrum Analysis", Jul. 2004, ED Online ID #8504, Microwaves & RF.*
Agilent Technologies, "Users Guide Agilent Technologies 8753ET and 8753ES Network Analyzers", Jun. 2002, pp. 1.1-1.6, 1.71-1.77.*

* cited by examiner

*Primary Examiner* — Patrick J Assouad
*Assistant Examiner* — Vincent P Spinella-Mamo
(74) *Attorney, Agent, or Firm* — patenttm.us

(57) ABSTRACT

A frequency characteristic measuring apparatus measures a device under test in which the frequency of an input signal and the frequency of an output signal differ from each other, simplifying the configuration of a tracking generator and peripheral circuits associated with the tracking generator, and simultaneously measuring the characteristics of the input signal and the output signal of the device under test. A spectrum analyzer has mixers, local oscillators and IF sections as first and second measuring units for measuring frequency characteristics of two input signals by performing frequency sweep in correspondence with a first or second frequency range, a mixer and an oscillator as a tracking generator section which operates by being linked to the frequency sweep operation in the first measuring unit, and a section which generates a trigger signal designating measurement start timing.

11 Claims, 3 Drawing Sheets

FREQUENCY CHARACTERISTIC MEASURING APPARATUS

BACKGROUND OF THE INVENTION

1. Field of the Invention

The present invention relates to a frequency characteristic measuring apparatus for measuring a frequency characteristic or the like of an input signal in a spectrum analyzer having a tracking generator function.

2. Description of the Related Art

A spectrum analyzer is known which incorporates a tracking generator, and which is capable of separately setting a frequency sweep range through which an output signal from the tracking generator is swept and a frequency sweep range through which a frequency characteristic is measured (see, for example, Japanese Patent Laid-Open No. 7-260825). With this spectrum analyzer, a frequency characteristic of a device under test, e.g., a frequency converter having an output frequency different from an input frequency can be measured.

In many cases, an ordinary spectrum analyzer having a tracking generator is used for measurement of a frequency characteristic of a device under test having an output frequency and an input frequency equal to each other (ordinary measurement). With the spectrum analyzer disclosed in Japanese Patent Laid-Open No. 7-260825, therefore, there is a problem that the tracking generator or peripheral circuits associated with the tracking generator are made complicated for selective execution of the ordinary measurement and a measurement suitable for a frequency converter or the like.

Also, the conventional spectrum analyzer is capable of measuring a frequency characteristic of an output signal from a device under test but incapable of simultaneously measuring a frequency characteristic of a signal input to the device under test and incapable of comparing the characteristics of the input signal and the output signal.

SUMMARY OF THE INVENTION

In view of the above-described circumstances, an object of the present invention is to provide a frequency characteristic measuring apparatus capable of measuring frequency characteristics of a device under test in which the frequency of an input signal and the frequency of an output signal differ from each other, capable of simplifying the configuration of a tracking generator and peripheral circuits associated with the tracking generator, and capable of simultaneously measuring the characteristics of the input signal and the output signal of the device under test.

According to the present invention, there is provided a frequency characteristic measuring apparatus including a first measuring unit which measures a frequency characteristic of a first input signal by performing frequency sweep corresponding to a first frequency range, a second measuring unit which measures a frequency characteristic of a second input signal by performing frequency sweep corresponding to a second frequency range, a tracking generator section which operates by being linked to the frequency sweep operation in the first measuring unit, and outputs an output signal having the same frequency as that of the first input signal as a frequency characteristic measurement target, and a trigger generating unit which generates a trigger signal designating measurement start timing in each of the first and second measuring units. The first and second measuring units capable of separately setting frequency ranges are provided to enable measurement of a frequency characteristic of an output signal from a device under test such as a frequency converter connected to the tracking generator section linked to the first measuring unit, by inputting the output signal from the device under test to the second measuring unit. The tracking generator section itself may use an ordinary tracking generator configuration without modifying the same, so that the entire configuration can be simplified.

Preferably, the output signal from the tracking generator section is input as the first input signal to the first measuring unit. In this way, a frequency characteristic of a signal input to the device under test connected to the tracking generator and a frequency characteristic of an output signal from the device can be measured simultaneously with each other.

Preferably, the second frequency range is set by being shifted by a predetermined value from the first frequency range, and the frequency sweep in the second measuring unit and the frequency sweep of the output signal by the tracking generator section linked to the frequency sweep in the first measuring unit are started simultaneously with each other in response to the trigger signal generated by the trigger generating unit. In this way, the operation to sweep the frequency of the output signal with the tracking generator section and the frequency sweep operation in the second measuring unit to which the output signal from the device under test is input can be linked to each other.

More specifically, each of the first and second measuring units has a local oscillator which performs frequency sweep, a first mixer which makes frequency conversion of the input signal by using a local oscillation signal output from the local oscillator, and an intermediate frequency filter which extracts a signal component of a predetermined frequency from an intermediate frequency signal output from the first mixer, and the tracking generator section has a second mixer which makes frequency conversion by using the local oscillation signal output from the local oscillator included in the first measuring unit.

Preferably, each of the first and second measuring units further includes a characteristic value measuring unit which measures a characteristic value of the signal component extracted by using the intermediate frequency filter.

Preferably, the frequency characteristic measuring apparatus further includes a characteristic value measuring unit which measures characteristic values of signal components extracted by using the intermediate frequency filters respectively included in the first and second measuring units. By using common characteristic value measuring unit adapted to each of the first and second measuring units, the number of component parts can reduced to reduce the manufacturing cost.

Preferably, the frequency characteristic measuring apparatus further includes a display processing unit which simultaneously displays on a display section the characteristic values obtained in correspondence with the first and second measuring units. In this way, comparison between frequency characteristics of the input and output signals of the device under test using the first and second measuring units is facilitated.

Preferably, the direction of frequency sweep of the output signal from the tracking generator section and the direction of frequency sweep by the second measuring unit can be set in either of a state of being the same and a state of being opposite to each other. In this way, measurement on various frequency converters differing in type (polarity) to the device under test is enabled.

DETAILED DESCRIPTION OF THE PREFERRED EMBODIMENT

Figure 1:
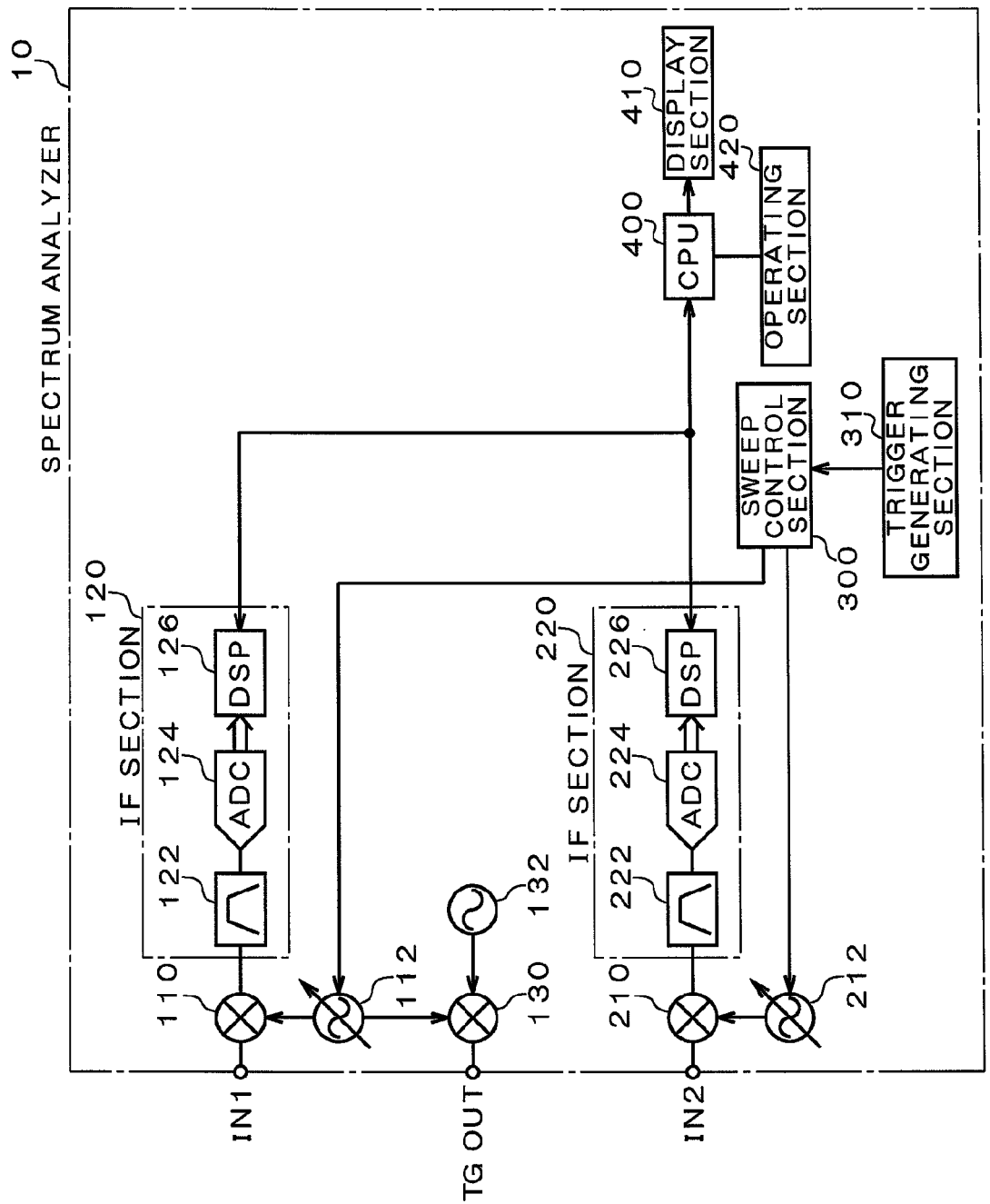
FIG. 1 is a diagram showing the configuration of a spectrum analyzer according to an embodiment of the present invention.

A spectrum analyzer which is a frequency characteristic measuring apparatus according to an embodiment of the present invention will be described in detail with reference to the accompanying drawings. FIG. 1 is a diagram showing the configuration of a spectrum analyzer in an embodiment of the present invention. As shown in FIG. 1, the spectrum analyzer 10 in the present embodiment includes mixers 110, 130, and 210, local oscillators 112 and 212, intermediate frequency processing sections (IF sections) 120 and 220, an oscillator 132, a sweep control section 300, a trigger generating section 310, a CPU 400, a display section 410, and an operating section 420.

The spectrum analyzer 10 in the present embodiment has two input terminals IN1 and IN2 through which measurement target signals are input, and a tracking generator output terminal TG OUT. The spectrum analyzer 10 simultaneously measures frequency characteristics of two measurement target signals fin1 and fin2 input through the two input terminals IN1 and IN2, and displays spectrums as measurement results.

The mixer 110, the local oscillator 112 and the intermediate frequency processing sections (IF section 120) are provided in the spectrum analyzer 10 to measure frequency characteristics of the measurement target signal fin1 input through one input terminal IN1. The mixer 110 is supplied with the measurement target signal fin1 input through one input terminal IN1 and a local oscillation signal $f_{osc1}$ output from the local oscillator 112, and outputs a signal which is a mixture of the measurement target signal fin1 and the local oscillation signal $f_{osc1}$. The local oscillator 112 outputs the local oscillation signal $f_{osc1}$ whose oscillation frequency is sweepable through a predetermined range.

The IF section 120 performs analog signal processing and digital signal processing on the output signal from the mixer 110 to measure frequency characteristics of the measurement target signal fin1 input through one input terminal IN1. The IF section 120 includes an intermediate frequency filter 122, an analog-to-digital converter (ADC) 124 and a digital signal processor (DSP) 126. The intermediate frequency filter 122 is a band-pass filter which allows only a predetermined intermediate frequency component (intermediate frequency signal) in the output signal from the mixer 110 to pass therethrough. The ADC 124 converts the intermediate frequency signal output from the intermediate frequency filter 122 into digital data by sampling at a predetermined sampling frequency. The DSP 126 performs various kinds of signal processing on the intermediate frequency signal converted into digital data, thereby measuring characteristic values (e.g., the signal level and the bit error rate) of the intermediate frequency signal. More specifically, the DSP 126 performs processing including demodulation processing and image removal processing on the intermediate frequency signal.

Similarly, the mixer 210, the local oscillator 212 and the IF section 220 are provided in the spectrum analyzer 10 to measure frequency characteristics of the measurement target signal fin2 input through the other input terminal IN2. The mixer 210 is supplied with the measurement target signal fin2 input from the other input terminal IN2 and a local oscillation signal $f_{osc2}$ output from the local oscillator 212, and outputs a signal which is a mixture of the measurement target signal fin2 and the local oscillation signal $f_{osc2}$. The local oscillator 212 outputs the local oscillation signal $f_{osc2}$ whose oscillation frequency is sweepable through a predetermined range.

The IF section 220 performs analog signal processing and digital signal processing on the output signal from the mixer 210 to measure frequency characteristics. The IF section 220 includes an intermediate frequency filter 222, an analog-to-digital converter (ADC) 224 and a digital signal processor (DSP) 226. The intermediate frequency filter 222 is a band-pass filter which allows only a predetermined intermediate frequency component (intermediate frequency signal) in the output signal from the mixer 210 to pass therethrough. The ADC 224 converts the intermediate frequency signal output from the intermediate frequency filter 222 into digital data by sampling at a predetermined sampling frequency. The DSP 226 performs various kinds of signal processing on the intermediate frequency signal converted into digital data, thereby measuring characteristic values of the intermediate frequency signal. More specifically, the DSP 226 performs processing including demodulation processing and image removal processing on the intermediate frequency signal.

Only the essential portion of the configuration necessary for measurement of frequency characteristics has been described. In actuality, however, attenuators are provided between the input terminal IN1 and the mixer 110 and between the input terminal IN2 and the mixer 210 to perform signal level adjustment. The configuration necessary for frequency measurement can be changed as desired according to required specifications. However, it is important in application of the present invention that two sections identical in configuration to each other be provided.

The mixer 130 and the oscillator 132 are provided in the spectrum analyzer 10 to generate a signal to be output from the output terminal TG OUT (hereinafter referred to as "TG signal"). The mixer 130 is supplied with the local oscillation signal $f_{osc1}$ output from the local oscillator 112 and an output signal from the oscillator 132, and outputs a signal which is a mixture of these signals. The oscillator 132 has a fixed oscillation frequency, for example, an oscillation frequency equal to the frequency of the intermediate frequency signal output from the intermediate frequency filter 122 in the IF section 120. Under this condition, when the local oscillation signal $f_{osc1}$ having the predetermined frequency is output from the local oscillator 112, the frequency of the TG signal output from the output terminal TG OUT and the measurement target signal fin1 input through the input terminal IN1 in correspondence with the intermediate frequency signal output from the intermediate frequency filter 122 coincide with each other.

When a trigger signal is input to the sweep control section 300, the sweep control section 300 simultaneously sends commands to the two local oscillators 112 and 212 to perform sweep control so that the local oscillation signals equal to or different from each other in frequency are output from the two local oscillators 112 and 212 simultaneously with each other. More specifically, the sweep control section 300 includes a first PLL circuit (not shown) including the one local oscillator 112 and a variable frequency divider, and a second PLL circuit (not shown) including the other local oscillator 212 and a variable frequency divider. The sweep control section 300 maintains the frequency dividing ratios of the two variable frequency dividers so that the frequency dividing ratios are equal to each other at all times or changes the frequency dividing ratios while maintaining a predetermined difference therebetween, thus performing frequency sweep of the local oscillation signals of the two local oscillators 112 and 212. The trigger generating section 310 generates the trigger signal when a user enters a command to start measuring. This trigger signal is input to the sweep control section 300.

The CPU 400 performs overall control of the spectrum analyzer 10 and performs processing for simultaneously displaying through the display section 410 the two measurement results (characteristic values) output from the IF sections 120 and 220 and processing for setting a measurement condition according to a command from a user using the operating section 420. The operating section 420 is provided with a plurality of operating devices such as switches and variable resistors to be operated by the user. The user enters a command to set a measurement condition, a command to start measuring, a command to stop measuring and other commands by operating the operating devices.

The above-described mixer 110, local oscillator 112 and IF section 120 correspond to the first measuring unit; the mixer 210, local oscillator 212 and IF section 220 correspond to the second measuring unit; the mixer 130 and oscillator 132 correspond to the tracking generator section; the trigger generating section 310 corresponds to the trigger generating unit; the DSPs 126 and 226 correspond to the characteristic value measuring unit; and the CPU 400 corresponds to the display processing unit.

The spectrum analyzer 10 in the present embodiment has the above-described configuration. A connection to the spectrum analyzer 10 and the operation of the spectrum analyzer 10 in a case where a frequency converter is externally connected as a device under test (DUT) to measure frequency characteristics will next be described.

Figure 2:
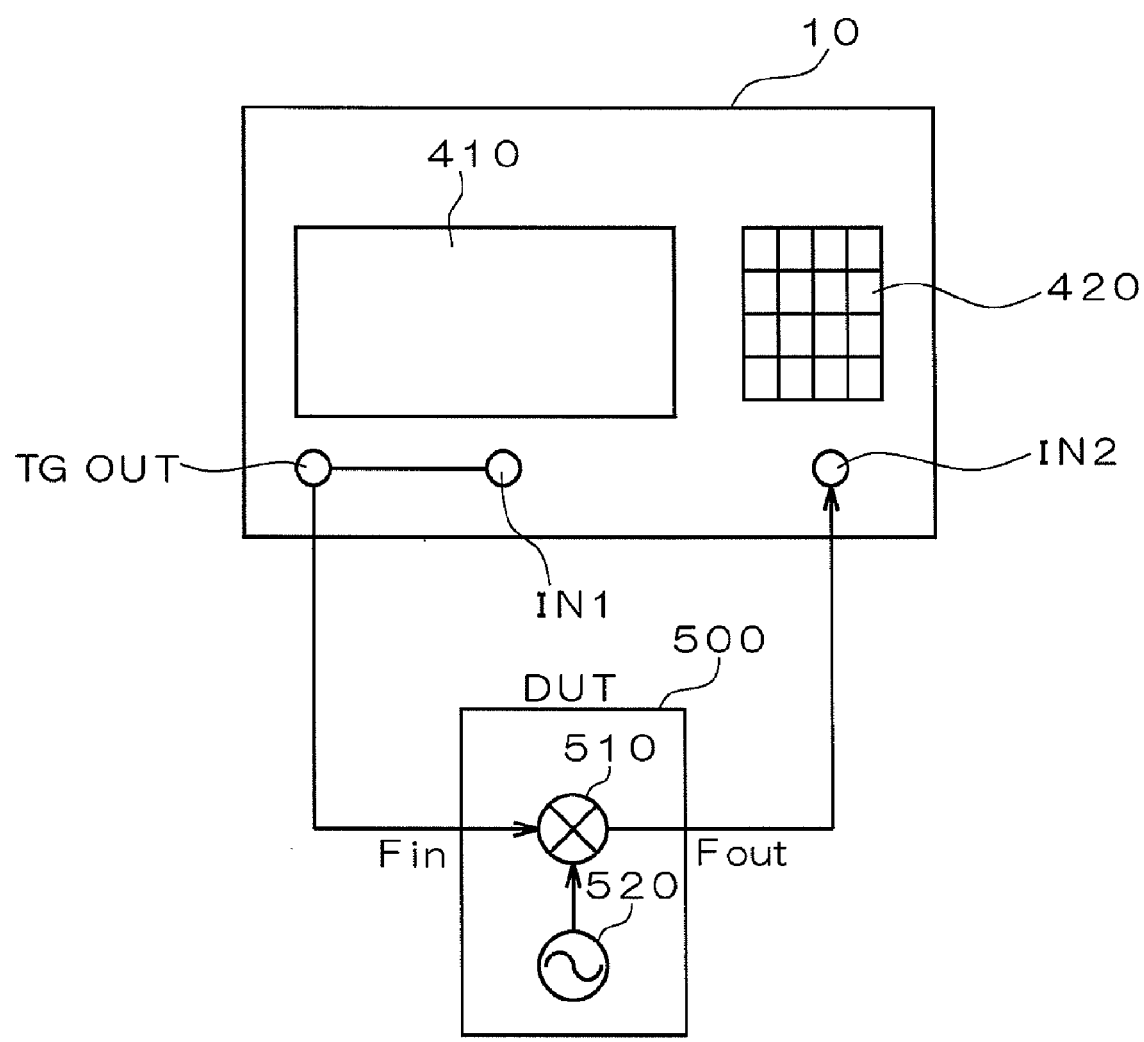
FIG. 2 is a diagram showing the form of connection between the spectrum analyzer and a DUT and the internal configuration of the DUT in the present embodiment.

FIG. 2 is a diagram showing the state of connection between the spectrum analyzer 10 and a DUT 500 and the internal configuration of the DUT 500 in the present embodiment. The DUT 500 is a frequency converter (e.g., down-converter) including a mixer 510 and an oscillator 520 having an oscillation frequency of $\Delta F$. When frequency characteristics of the DUT 500 are measured, an input terminal of the DUT 500 is connected to the output terminal TG OUT of the spectrum analyzer 10 and an output terminal of the DUT 500 is connected to the input terminal IN2 of the spectrum analyzer 10. In the DUT 500, the mixer 510 is supplied with the TG signal (frequency Fin) output from the output terminal TG OUT of the spectrum analyzer 10 and the signal (frequency $\Delta F$) output from the oscillator 520, and outputs a signal having a frequency Fin$-\Delta F$. This output signal is supplied to the input terminal IN2 of the spectrum analyzer 10. In the present embodiment, the output terminal TG OUT of the spectrum analyzer 10 is connected to the other input terminal IN1 to simultaneously measure frequency characteristics of a signal input to the DUT 500.

Figure 3:
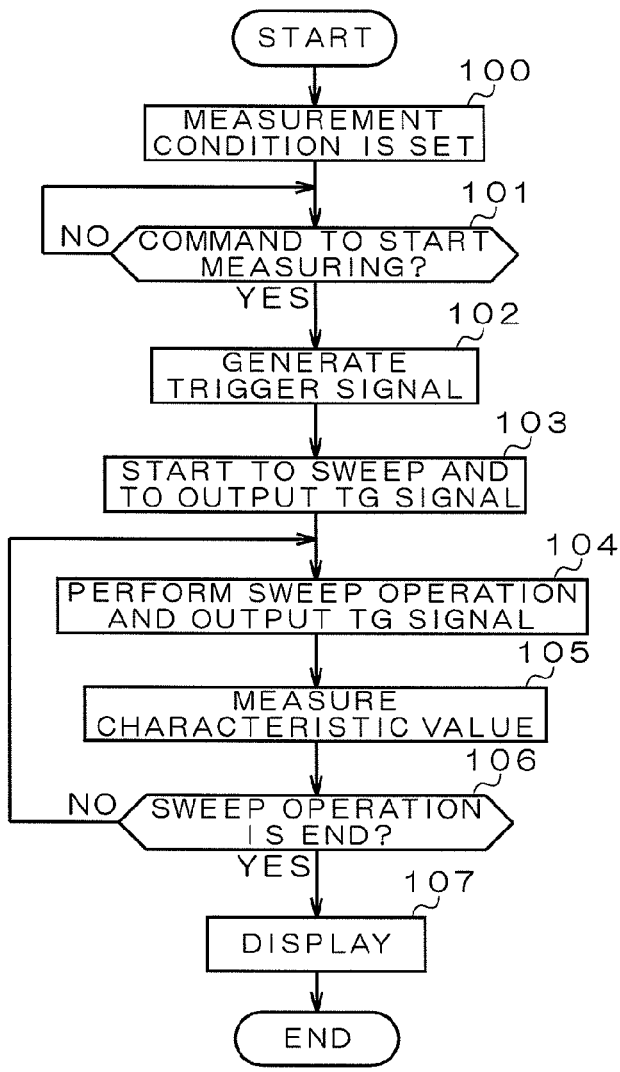
FIG. 3 is a flowchart showing the process of operating the spectrum analyzer in the present embodiment.

FIG. 3 is a flowchart showing the process of operating the spectrum analyzer 10 in the present embodiment. A measurement condition is set according to the content of a command from a user (step 100), and the CPU 400 thereafter determines whether or not a command to start measuring has been issued (step 101). In order to measure frequency characteristics of the DUT 500 (down-converter) in the present embodiment, it is necessary for the user to set, in step 100, as a frequency sweep range corresponding to the one input terminal IN2, a frequency sweep range equal in sweep width to frequency sweep range corresponding to the other input terminal IN1 and entirely shifted to a lower frequency by $\Delta F$ from the frequency sweep range corresponding to the other input terminal IN1. When no command to start measuring is issued, a negative determination result is obtained in determination in step 101 and determination in step 101 is repeated.

When a command to start measuring is issued, an affirmative determination result is obtained in determination in step 101. The trigger generating section 310 then generates a trigger signal (step 102). The trigger signal may be generated, for example, by outputting a signal in pulse form or changing the level of a signal from a low level to a high level (or changing the level of a signal from a high level to a low level).

When the trigger signal is input, the sweep control section 300 simultaneously sends sweep commands to the two local oscillators 112 and 212 to perform frequency sweep operations with the two local oscillators 121 and 212 from the same starting time, and to output the TG signal from the output terminal TG OUT (steps 103 and 104). In parallel with the frequency sweep operations, the IF sections 120 and 220 respectively measure characteristic values of the intermediate frequency signals (step 105).

The sweep control section 300 also determines whether or not an end of the sweep is reached (step 106), obtains an negative determination result before the sweep frequency reaches the upper limit (or the lower limit) of the measuring range, and returns the process to step 104 to continue the frequency sweep. When the sweep frequency reaches the upper limit (or the lower limit) of the measuring range, an affirmative determination result is obtained in determination in step 106. Subsequently, the CPU 400 displays the results of measurement with the two IF sections 120 and 220 through the display section 410 (step 107), thereby completing the sequence of operations for measuring the frequency characteristics of the DUT 500.

Figure 4:
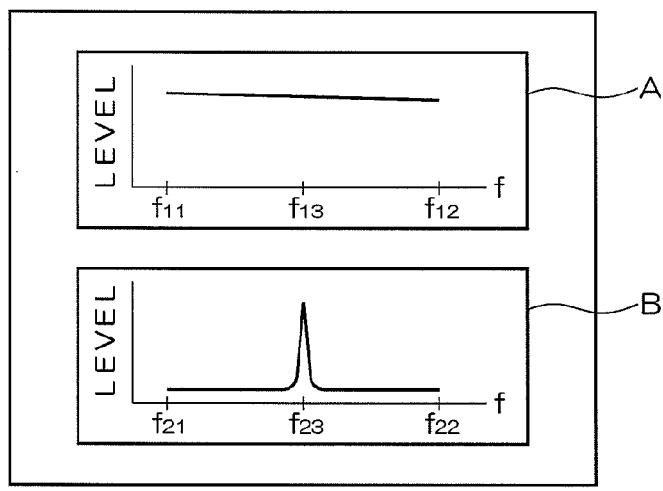
FIG. 4 is a diagram showing an example of display on the spectrum analyzer in the present embodiment.

FIG. 4 is a diagram showing an example of display on the spectrum analyzer 10 in the present embodiment in a case where two measurement results are displayed in a side-by-side fashion in an on-screen display. As shown in FIG. 4, an on-screen display on the display section 410 includes two display areas A and B. One display area A is for display of the result of measurement with one IF section 120 (a frequency characteristic of the TG signal input to the DUT 500), and a frequency spectrum in a frequency range from f11 to f12 is displayed in the display area A. The other display area B is for display of the result of measurement with other IF section 220 (a frequency characteristic of the output signal from the DUT 500), and a frequency spectrum in a frequency range from f21 to f22 (f11$-\Delta F$=f21, f12$-\Delta F$=f22) which is entirely shifted to a lower frequency by $\Delta F$ from the frequency range from f11 to f12 in the display area A is displayed in the display area B.

Thus, in the spectrum analyzer 10 in the present embodiment, two measuring units capable of separately setting frequency ranges are provided to enable measurement of frequency characteristics of the output signal from the DUT 500, which is, for example, a frequency converter, and which is connected to the tracking generator section linked to one of the two measuring units, by inputting the output signal from the DUT 500 to the other measuring unit. The tracking generator section itself may directly use an ordinary tracking generator configuration without modifying the same, so that the entire configuration can be simplified. If only the input terminal IN1 and the output terminal TG OUT are connected directly, frequency characteristics of input and output signals of DUT 500 can be measured simultaneously with each other. Also, comparison between frequency characteristics of input and output signals of DUT 500 is facilitated by simultaneously measuring the frequency characteristics and displaying the results of measurement in a side-by-side fashion.

The present invention is not limited to the above-described embodiment. Various changes and modifications may be made in the embodiment within the scope of the present invention. For example, while the embodiment has been described with respect to a case where the DUT 500 is a down-converter, the present invention can also be applied even in a case where the DUT 500 is an up-converter. In such a case, the mixer 510 in the DUT 500 is supplied with the TG signal (frequency Fin) output from the output terminal TG OUT of the spectrum analyzer 10 and the signal (frequency ΔF) output from the oscillator 520, and outputs a signal having a frequency Fin+ΔF.

Also, the embodiment has been described with respect to a case where when the frequency of the TG signal output from the output terminal TG OUT is frequency-swept from the low frequency side to the high frequency side, the frequency of the output from the DUT 500 also changes from the low frequency side to the high frequency side. However, some frequency converter may be such that when the frequency of the TG signal output from the output terminal TG OUT is frequency-swept from the low frequency side to the high frequency side, the frequency of the output from the DUT 500 changes from the high frequency side to the low frequency side. The present invention can also be applied to the DUT 500 in such a case. For example, the direction of frequency sweep corresponding to the input terminal IN1 and the direction of frequency sweep corresponding to the input terminal IN2 may be set opposite to each other in measurement condition setting in step 100 shown in FIG. 3. Frequency sweep based on this setting content is performed by the sweep control section 300. The combination of the frequency sweep directions (whether the directions are set the same or opposite to each other) can be set by a user using the operating section 420 as required. Measurement on various frequency converters differing in type (polarity) is thus enabled.

Also, while the embodiment has been described by assuming that the DUT 500 is a frequency converter, frequency characteristic measurement can also be performed on any DUT 500 other than frequency converts if the frequency of an output signal from the DUT 500 is shifted by ΔF from the frequency of a signal input to the DUT 500.

While two measurement results are displayed in a side-by-side fashion in the example of display shown in FIG. 4, measurement results may be displayed by being superposed one on another in a state of being discriminable from each other (for example, in different colors).

While in the above-described embodiment two sections are provided to simultaneously measure frequency characteristics of two input signals, three or more sections may be provided to simultaneously measure frequency characteristics of three or more input signals. In such a case, the tracking generator section is associated with one of the sections.

While two DSPs 126 and 226 are provided in the above-described embodiment, one DSP 226 may be removed and the other DSP 126 may perform the processing in the DSP 226 if its throughput is sufficiently high. The manufacturing cost can be reduced by reducing the number of component parts in this way.

What is claimed is:

1. A frequency characteristic measuring apparatus comprising:
    a first measuring unit which measures a frequency characteristic of a first input signal by performing frequency sweep corresponding to a first frequency range;
    a second measuring unit which measures a frequency characteristic of a second input signal by performing frequency sweep corresponding to a second frequency range;
    a tracking generator section which operates by being linked to the frequency sweep operation in the first measuring unit, and outputs an output signal having the same frequency as that of the first input signal as a frequency characteristic measurement target; and
    a trigger generating unit which generates a trigger signal designating measurement start timing in each of the first and second measuring units,
    wherein the output signal from the tracking generator section is input as the first input signal to the first measuring unit, and
    wherein the output signal from the tracking generator section is input to a device under test, and an output signal from the device under test is input as the second input signal to the second measuring unit.

2. The frequency characteristic measuring apparatus according to claim 1, wherein the second frequency range is set by being shifted by a predetermined value from the first frequency range, and
    wherein the frequency sweep in the second measuring unit and the frequency sweep of the output signal by the tracking generator section linked to the frequency sweep in the first measuring unit are started simultaneously with each other in response to the trigger signal generated by the trigger generating unit.

3. The frequency characteristic measuring apparatus according to claim 1, wherein each of the first and second measuring units has a local oscillator which performs frequency sweep, a first mixer which makes frequency conversion of the input signal by using a local oscillation signal output from the local oscillator, and an intermediate frequency filter which extracts a signal component of a predetermined frequency from an intermediate frequency signal output from the first mixer, and
    wherein the tracking generator section has a second mixer which makes frequency conversion by using the local oscillation signal output from the local oscillator included in the first measuring unit.

4. The frequency characteristic measuring apparatus according to claim 1, wherein each of the first and second measuring units further includes a characteristic value measuring unit which measures a characteristic value of the signal component extracted by using the intermediate frequency filter.

5. The frequency characteristic measuring apparatus according to claim 4, further comprising a display processing unit which simultaneously displays on a display section the characteristic values obtained in correspondence with the first and second measuring units.

6. The frequency characteristic measuring apparatus according to claim 3, further comprising a characteristic value measuring unit which measures characteristic values of signal components extracted by using the intermediate frequency filters respectively included in the first and second measuring units.

7. The frequency characteristic measuring apparatus according to claim 6, further comprising a display processing unit which simultaneously displays on a display section the characteristic values obtained in correspondence with the first and second measuring units.

8. The frequency characteristic measuring apparatus according to claim 1, wherein the direction of frequency sweep of the output signal from the tracking generator section and the direction of frequency sweep by the second measuring unit can be set in either of a state of being the same and a state of being opposite to each other.

9. The frequency characteristic measuring apparatus according to claim 1, wherein the device under test is a frequency converter.

10. The frequency characteristic measuring apparatus according to claim 9, wherein the frequency converter is a down-converter.

11. The frequency characteristic measuring apparatus according to claim 9, wherein the frequency converter is an up-converter.

* * * * *